(12) United States Patent
Raben

(10) Patent No.: US 11,823,986 B2
(45) Date of Patent: Nov. 21, 2023

(54) MOLDED RF POWER PACKAGE

(71) Applicant: Ampleon Netherlands B.V., Nijmegen (NL)

(72) Inventor: Leonardus Theodorus Maria Raben, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 131 days.

(21) Appl. No.: 17/478,049

(22) Filed: Sep. 17, 2021

(65) Prior Publication Data

US 2022/0093495 A1    Mar. 24, 2022

(51) Int. Cl.
| | | |
|---|---|---|
| H01L 23/495 | (2006.01) | |
| H01L 21/48 | (2006.01) | |
| H01L 21/56 | (2006.01) | |
| H01L 23/498 | (2006.01) | |
| H01L 23/31 | (2006.01) | |
| H01L 23/00 | (2006.01) | |

(52) U.S. Cl.
CPC .... H01L 23/49555 (2013.01); H01L 21/4842 (2013.01); H01L 21/565 (2013.01); H01L 23/49861 (2013.01); H01L 23/3121 (2013.01); H01L 23/49568 (2013.01); H01L 24/48 (2013.01); H01L 2224/48245 (2013.01)

(58) Field of Classification Search
CPC ...................... H01L 23/49555; H01L 21/4842
USPC ........................................................ 257/668
See application file for complete search history.

(56) References Cited

U.S. PATENT DOCUMENTS

| | | | |
|---|---|---|---|
| 6,075,283 A | | 6/2000 | Kinsman et al. |
| 2009/0091007 A1* | | 4/2009 | Tellkamp ............. H05K 3/3426 438/112 |
| 2018/0040487 A1 | | 2/2018 | Takahashi |

FOREIGN PATENT DOCUMENTS

WO      2000/074460      12/2000

* cited by examiner

*Primary Examiner* — Quoc D Hoang
(74) *Attorney, Agent, or Firm* — McDonnell Boehnen Hulbert & Berghoff LLP

(57) ABSTRACT

The present disclosure relates to a molded radiofrequency, 'RF', power package. The present disclosure further relates to a method for manufacturing such package.
According to example embodiments, weakening structures are provided in the leads to allow the leads to be bent without causing delamination in the body of solidified molding compound.

24 Claims, 9 Drawing Sheets

MOLDED RF POWER PACKAGE

CROSS-REFERENCE TO RELATED APPLICATIONS

The present application is a non-provisional patent application claiming priority to Netherlands Patent Application No. NL 2026503, filed Sep. 18, 2020, the contents of which are hereby incorporated by reference.

FIELD OF THE DISCLOSURE

The present disclosure relates to a molded radiofrequency, 'RF', power package. The present disclosure further relates to a method for manufacturing such package.

BACKGROUND

An example of a molded RF power package is provided in FIG. 1. A corresponding top view is shown in FIG. 5.

In FIG. 1, a package 1 is shown that comprises a heat-conducting substrate 30 having a first surface, corresponding to the top surface in FIG. 1, and an opposing second surface. Heat-conducting substrate 30 is typically made from copper or a copper alloy. A semiconductor die 10 is arranged on the first surface of heat-conducting substrate 30. On semiconductor die 10 an RF power transistor is integrated thereon.

Known package 1 further comprises a plurality of leads 20 and a body of solidified molding compound that fixedly connects heat-conducting substrate 30 to the plurality of leads 20 by directly adhering to the plurality of leads 20 and heat-conducting substrate 30. In FIG. 1, the body of solidified molding compound comprises a lower part 40 that fixedly connected heat-conducting substrate 30 and leads 20, and an upper part 41. As shown, leads 20 extend through the body. Furthermore, the molding compound used can be any one of a thermo-set compound, such as Duroplast™, or a thermoplast compound, such as liquid crystal polymers.

A lid or cover 50 is used that is fixedly connected to the body of solidified molding compound. Lid 50 can be of the same material as the body of solidified molding compound. More in particular, lid 50 comprises a lid base 50A from which lid side walls 51 extend. Lid side walls 51 are fixedly connected to upper part 41 using an adhesive 42.

FIG. 2 illustrates lead 20 in more detail. More in particular, each lead 20 comprises a first lead end 20A, an opposing second lead end 20D, a first segment 20B connected directly to first lead end 20A, and a second segment 20C connected directly on one end to second lead end 20D and on an opposing end to the first segment 20B. Furthermore, the RF power transistor on semiconductor die 10 is connected to first lead ends 20A of the plurality of leads 20 using a plurality of bondwires 11. More in particular, as shown in FIG. 5, bondwires 11 extend between a bondbar 12 on semiconductor die 10 and leads 20.

As shown in FIG. 2, for each lead 20, first segment 20B fully extends inside the body of solidified molding compound whereas second segment 20C fully extends outside of the body of solidified molding compound.

FIGS. 1 and 2 illustrate package 1 with straight leads 20. However, the present disclosure relates to molded RF power packages having bent leads 20 or leads 20 that are configured to be bent. A general example of a lead 20 that has been bent is shown in FIG. 3. As shown, second segments 20C of the plurality of leads 20 are bent thereby dividing each second segment in a first sub-segment 20C1 extending substantially parallel to heat-conducting substrate 30 and away from the body of solidified molding compound, a curved sub-segment 20C2, and a second sub-segment 20C3 extending obliquely relative to first sub-segment 20C1 and connected to first sub-segment 20C1 through curved sub-segment 20C2.

Package of the type illustrated in FIGS. 1-3, use an injection or transfer molding process. For example, when the molding compound is a thermoset molding compound, transfer molding can be used. Alternatively, when the molding compound is a thermoplast molding compound, injection molding can be used. A general molding process is illustrated in more detail in FIG. 4. This figure illustrates an example of a first mold member 110 and a second mold member 120 for manufacturing package 1. These members together define a mold cavity. In the example shown in FIG. 4, semiconductor die 10 has been mounted to heat-conducting substrate 30 before arranging leads 20 and heat-conducting substrate 30 in the mold cavity. More in particular, at this stage, the leads 20 are still part of a lead frame. This lead frame comprises a lead frame body to which leads 20 are connected. Moreover, at the time of arranging into the mold cavity, heat-conducting substrate 30 is also connected to the lead frame body, for example by riveting.

First mold member 110 comprises a mold body that presses against leads 20 and heat-conducting substrate 30. More in particular, first mold member 110 encloses semiconductor die 10 in such a manner that molding compound will not enter space 10A. Using the molding process, molding compound will enter spaces 20A, 20B for generating the body of solidified molding compound. To aid in the molding process, it is known to arrange a resilient foil 111, 121 for both first mold member 110 and second mold member 120. Resilient foils 111, 121 can for instance be manufactured from Teflon.

The Applicant has found that the reliability of packages of the type illustrated in FIG. 1-4 in which the leads are bent, may be insufficient in some cases.

It is therefore an object of the present disclosure to provide a molded RF power package in which the reliability is improved.

SUMMARY

According to the present disclosure, this object is achieved using the molded RF power package as defined in claim 1 which is characterized in that the leads each further comprise a weakening structure arranged at least partially in the curved sub-segment, the weakening structure comprising at least one of a recess in or hole through the lead.

The Applicant has realized that the molded RF power package described in connection with FIGS. 1-4 relies on a proper sealing such that the liquid molding compound does not extend beyond spaces 20A, 20B. This sealing can only be achieved when first mold member 110 and second mold member 120 press with sufficient force onto leads 20. In turn, such force can only be exerted if leads 20 are sufficiently rigid such that leads 20 do not become damaged due to the exerted force.

However, this rigidity of leads 20 poses a problem when bending leads 20 as illustrated in FIG. 3. More in particular, the Applicant has found that when bending leads 20 of packages of the type illustrated in FIGS. 1-4, delamination of the molding compound may occur. More in particular, the solidified molding compound may get detached from first segment 20B. Such detachment degrades the reliability of the package.

According to the present disclosure, the leads are mechanically weakened using the weakening structure in the curved sub-segment. This allows the leads to be bent, e.g. into a gull wing shape, without causing excessive delamination forces to be generated between the solidified molding compound and the leads. When the weakening structure is not used, the relatively large force exerted onto the second lead end and/or second segment will be at least partially transferred to the boundary between the leads and the body of solidified molding compound thereby increasing the risk of delamination. The present disclosure is not limited to gull wing shaped leads. For example, the present disclosure equally relates to embodiments in which the leads are only bent in the curved sub-segment.

It is noted that the present disclosure also relates to embodiments that are identical to the packages shown in FIGS. 1-4 with the exception of the features that are described next.

A ratio between a length of the second sub-segment and a length of the first sub-segment can be at least 1, preferably more than 2.5.

Furthermore, a ratio between a length of the first sub-segment and a length of the curved sub-segment and is at least 0.2, and preferably more than 1. Additionally or alternatively, a length of the first sub-segment is at least 100 micrometer, more preferably at least 500 micrometer.

The molded RF power package is typically soldered to a printer circuit board. According to the present disclosure, the weakening structure is provided such that the solder used for such soldering process does not reach the weakening structure. Put differently, the weakening structure is typically arranged close to the body of the solidified molding compound.

A thickness of the leads may lie in a range between 200 and 500 micrometer, preferably between 200 and 350 micrometer, and the leads can be made from copper, copper alloy, or other metal or metal alloy.

For each lead, the width thereof may change when moving in a direction away from the body of a solidified molding compound. However, for the lead or segment or part thereof, a maximum width can be defined. For example, a maximum width of the second segment in a direction parallel to a side of the body of solidified molding compound through which said each lead extends may lie in a range between 1 and 20 millimeter, and more preferably in between 5 and 15 millimeter.

For each lead, the weakening structure may comprise a plurality of holes spaced apart in a direction parallel to a side of the body of solidified molding compound through which said each lead extends. Furthermore, the holes of each lead may have a maximum inner size between 200 and 2000 micrometer and between 400 and 2000 micrometer in the direction parallel and in a direction perpendicular to a side of the body of solidified molding compound through which said each lead extends, respectively.

Additionally or alternatively, the weakening structure of each lead may comprise an elongated recess extending in a direction parallel to a side of the body of solidified molding compound through which said each lead extends. Furthermore, when the weakening structure also comprises the abovementioned holes, then the elongated recess can be provided in line with the holes for each lead.

Alternatively, the weakening structure of each lead may comprise at least one elongated recess extending in a direction perpendicular to a side of the body of solidified molding compound through which said each lead extends. In case the weakening structure also comprises holes, said at least one elongated recess may extend in between a pair of adjacent holes in said each lead.

For each lead, the first segment and the first sub-segment may have an identical maximum width in a direction parallel to a side of the body of solidified molding compound through which said each lead extends. Furthermore, for each lead, the first lead end and the first segment may have an identical maximum width in a direction parallel to a side of the body of solidified molding compound through which said each lead extends. Additionally or alternatively, for each lead the second segment can be divided into a first part directly adjacent to the first segment, a second part of which a width in said direction parallel to a side of the body of solidified molding compound through which said each lead extends is less than the maximum width of the first part, and a width transition part connecting the first part and second part and of which a width in said direction parallel to a side of the body of solidified molding compound through which said each lead extends decreases when moving away from the body. Here, it is noted that the width transition part may be very small such that a step-like change in width is obtained.

For RF power packages, the first lead end can be very wide due to the large sized RF power transistor(s) that are arranged on the semiconductor die. On the other hand, the width of the second lead end is typically dictated by a desired electrical performance. More in particular, the second lead end is typically part of the waveguide structure with a particular characteristic impedance. Typically, the second lead up is narrower than the first lead end. In known molded RF power packages, the difference in width is overcome inside the first segment, as illustrated in FIG. 5. The Applicant has found that these types of packages are prone to torsion of the leads during the molding process. Consequently, the sealing action of first mold part 110 and second mold part 120 in FIG. 4 may be insufficient to prevent that molding compound or components thereof reach the first lead end. This may complicate the wire bonding process to the first lead end and may therefore deteriorate reliability.

According to the present disclosure, by ensuring that the lead directly adjacent to the body of solidified molding compound has a width that is substantially identical to that of the first segment and/or first lead end, the part of the lead that is directly outside of the body of solidified molding compound, i.e. the first part, which is also the part of the lead that is pressed upon by the first and second mold part as shown in FIG. 4, provides an improved stiffness of the leads. This is referred to as lead extension. In this manner, torsion of the leads during the molding process becomes less likely and reliability of the package can be improved. According to the present disclosure, the increased stiffness of the leads attributed to the thickness of the leads and the abovementioned lead extension can be compensated using the weakening structure of the present disclosure such that bending is possible without causing delamination and without posing reliability problems associated with molding compound or components thereof polluting the wire bonding area on the first lead end.

For each lead, a length of the first part in a direction perpendicular to a side of the body of solidified molding compound through which said each lead extends lies in a range between 100 and 1000 micrometer.

Additionally or alternatively, the first sub-segment may correspond to the first part and a part of the width transition part or the first sub-segment corresponds to the first part. The weakening structures can be completely contained in the width transition part.

For each lead, a width of the first part and/or a width of the first segment can be substantially constant along a direction perpendicular to a side of the body of solidified molding compound through which said each lead extends.

For each lead, a width of the first lead end in a direction parallel to a side of the body of solidified molding compound through which said each lead extends may equal the width of the corresponding second lead end in the same direction plus at least 1 millimeter, or a ratio between the width of the second lead end and the width of the first lead end is less than 0.8.

The molded RF power package further comprises an air cavity inside the RF molded power package in which the semiconductor die and bondwires can be arranged, the air cavity being defined by the heat-conducting substrate, the body of solidified molding compound, and the cover. Alternatively, the semiconductor die and bondwires are encapsulated by the body of solidified molding compound. In such case, the solidified molding compound directly touches the bondwires and the semiconductor die.

The second surface of the heat-conducting substrate may be exposed on a backside of the package. In this manner, heat may be transported away from the semiconductor die through the heat-conducting substrate. At the same time, the heat-conducting substrate may provide efficient grounding. For example, the RF power transistor, such as a silicon-based laterally diffused metal-oxide-semiconductor, 'LDMOS', or gallium nitride based field-effect transistor, 'FET', may use grounding through the semiconductor die, e.g. by means of a conductive substrate or vias.

According to a second aspect, the present disclosure provides a method for manufacturing the abovementioned molded RF power package comprising the steps of
providing a heat-conducting substrate having a first surface and an opposing second surface, providing a semiconductor die, said semiconductor die having an RF power transistor integrated thereon, and providing a lead frame comprising a lead frame body, a plurality of leads connected to the lead frame body, and a heat-conducting substrate connected to the lead frame body, wherein each lead comprises a first lead end, an opposing second lead end, a first segment connected directly to the first lead end, and a second segment connected directly on one end to the second lead end and on an opposing end to the first segment.

As a next step, the lead frame is arranged into a molding cavity and a molding compound is applied into the molding cavity and where it is allowed to solidify for forming a body of solidified molding compound that fixedly connects the heat-conducting substrate to the plurality of leads by directly adhering to the plurality of leads and the heat-conducting substrate.

The first and second segment fully extend inside and outside the body of solidified molding compound, respectively. Furthermore, the method of the present disclosure further comprises providing a lid and fixedly connecting the lid to the body. By bending the second segments of the plurality of leads, each second segment is divided at least in a first sub-segment extending substantially parallel to the heat-conducting substrate and away from the body of solidified molding compound, a curved sub-segment, and a second sub-segment extending obliquely relative to the first sub-segment and connected to the first sub-segment through the curved sub-segment.

The leads each further comprise a weakening structure arranged at a boundary between the first and second sub-segment, the weakening structure comprising at least one of a recess in or hole through the lead.

According to the second aspect, the method may comprise the further steps of arranging the semiconductor die onto the first surface of the heat-conducting substrate and connecting the electronic circuitry to the first lead end of the plurality of leads using a plurality of bondwires, wherein said arranging of the semiconductor die onto the first surface of the heat-conducting substrate is performed prior to or after applying the molding compound. For molded RF power packages comprising an air cavity, the wire bonding is performed after the molding. For molded RF power packages not comprising an air cavity, the wire bonding is performed before molding.

Furthermore, the method of the present disclosure may include the step of bending the second segments of the leads.

BRIEF DESCRIPTION OF THE DRAWINGS

Next, the present disclosure will be described in more detail referring to the appended drawings, wherein.

DETAILED DESCRIPTION

Figure 1:
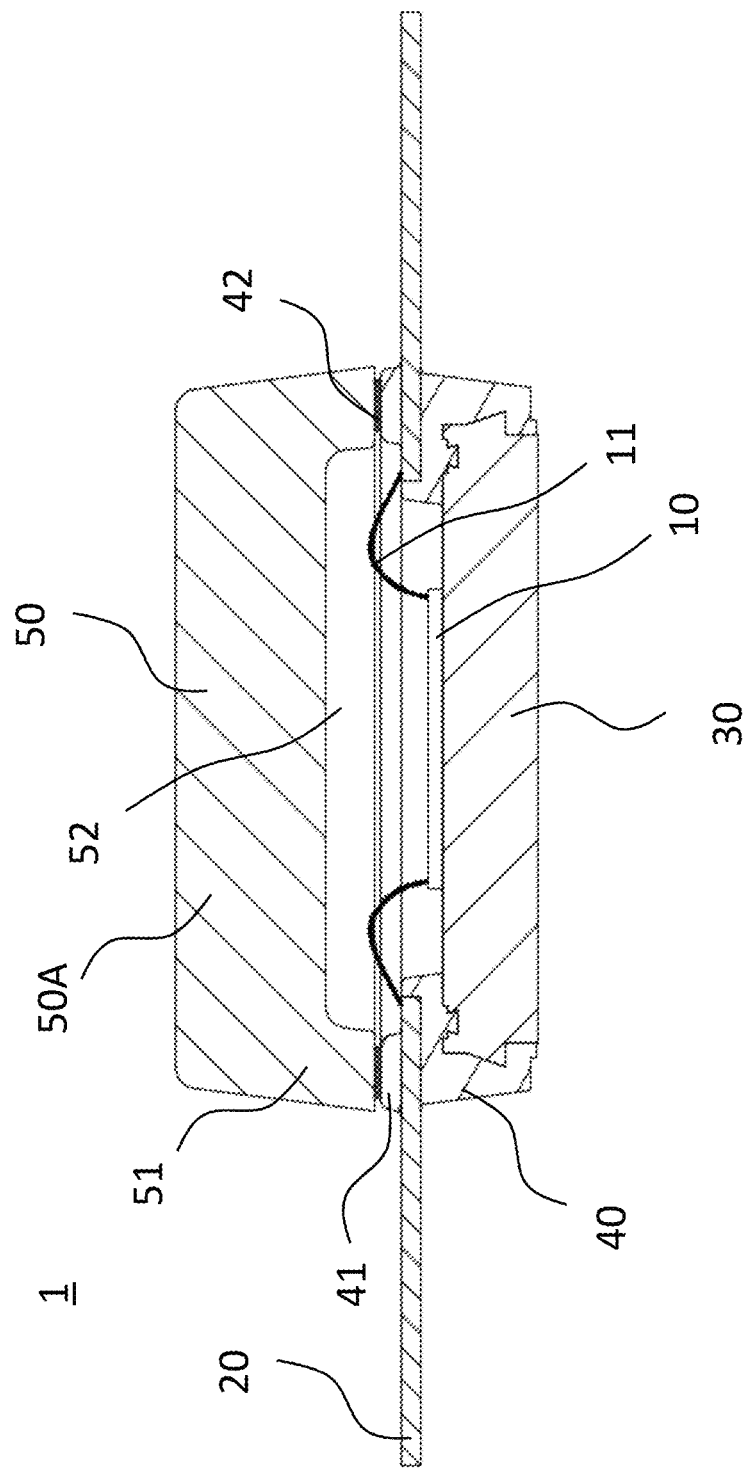
FIG. 1 illustrates a cross-sectional view of a known package.
Figure 2:
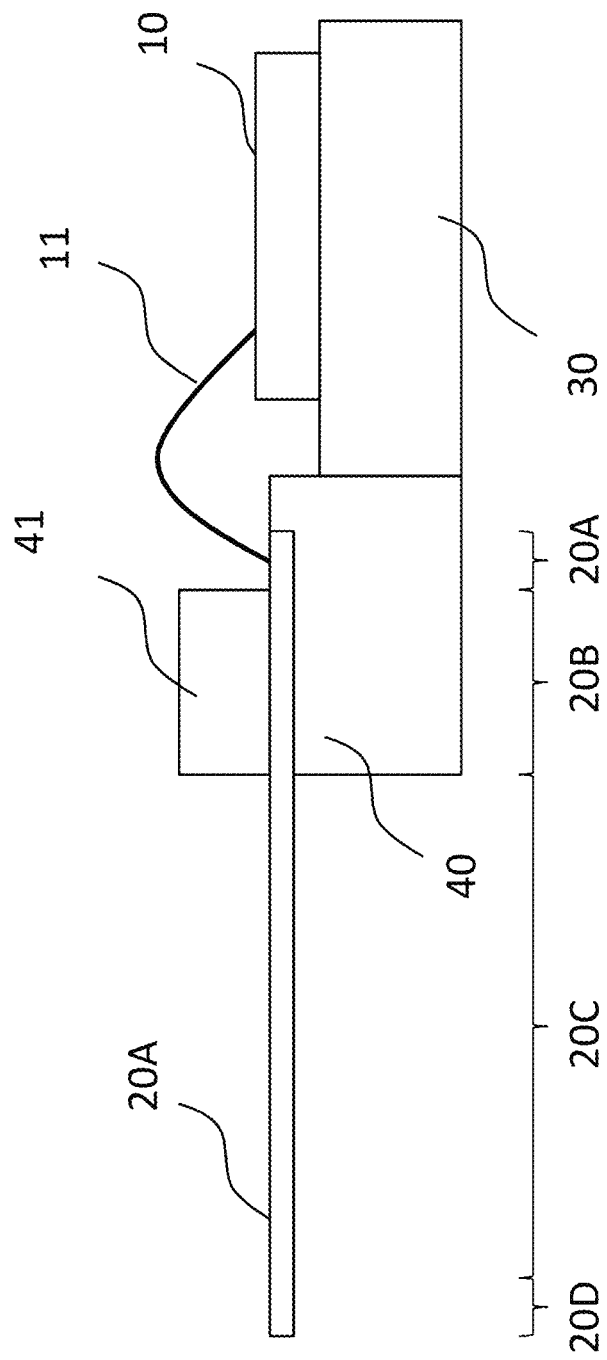
FIG. 2 illustrates the leads of the package of FIG. 1 in more detail.
Figure 3:
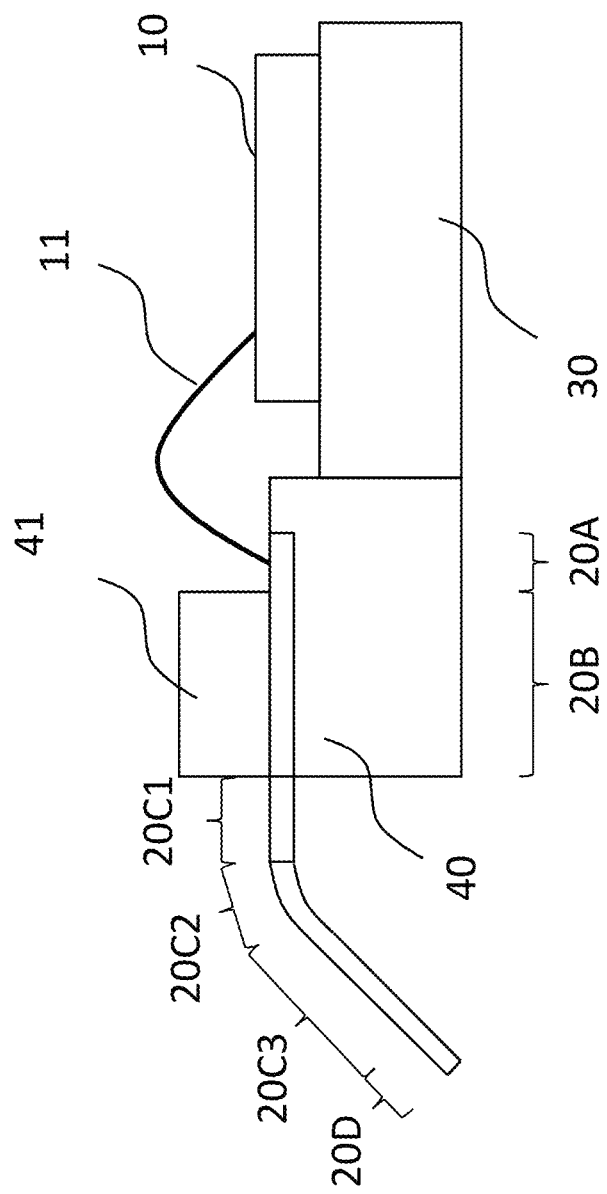
FIG. 3 illustrates the leads of the package of FIG. 1 in a bent state.
Figure 4:
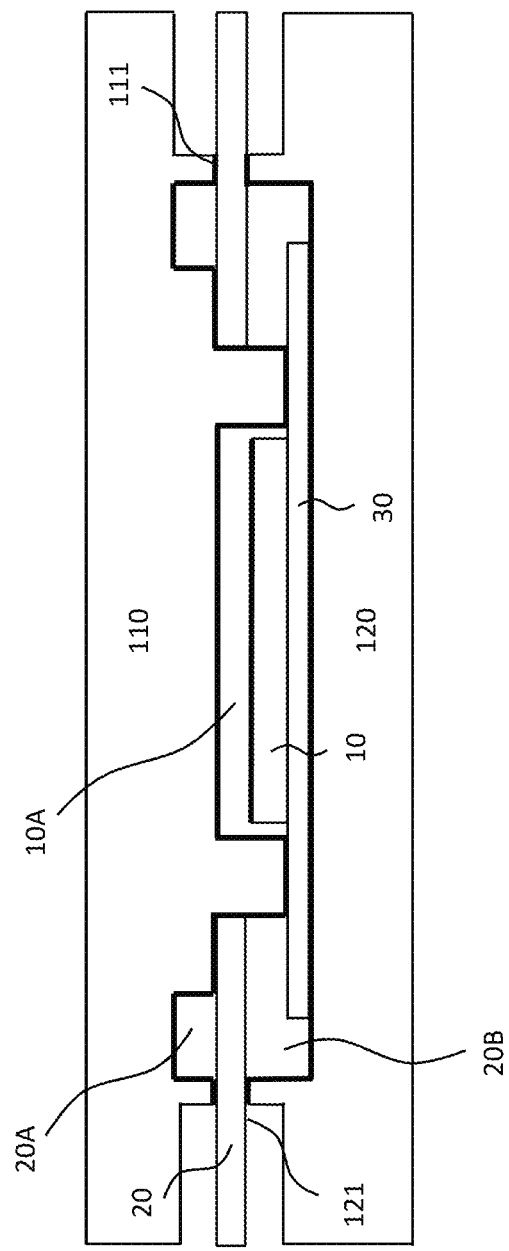
FIG. 4 illustrates a first and second mold member for manufacturing the package of FIG. 1.
Figure 5:
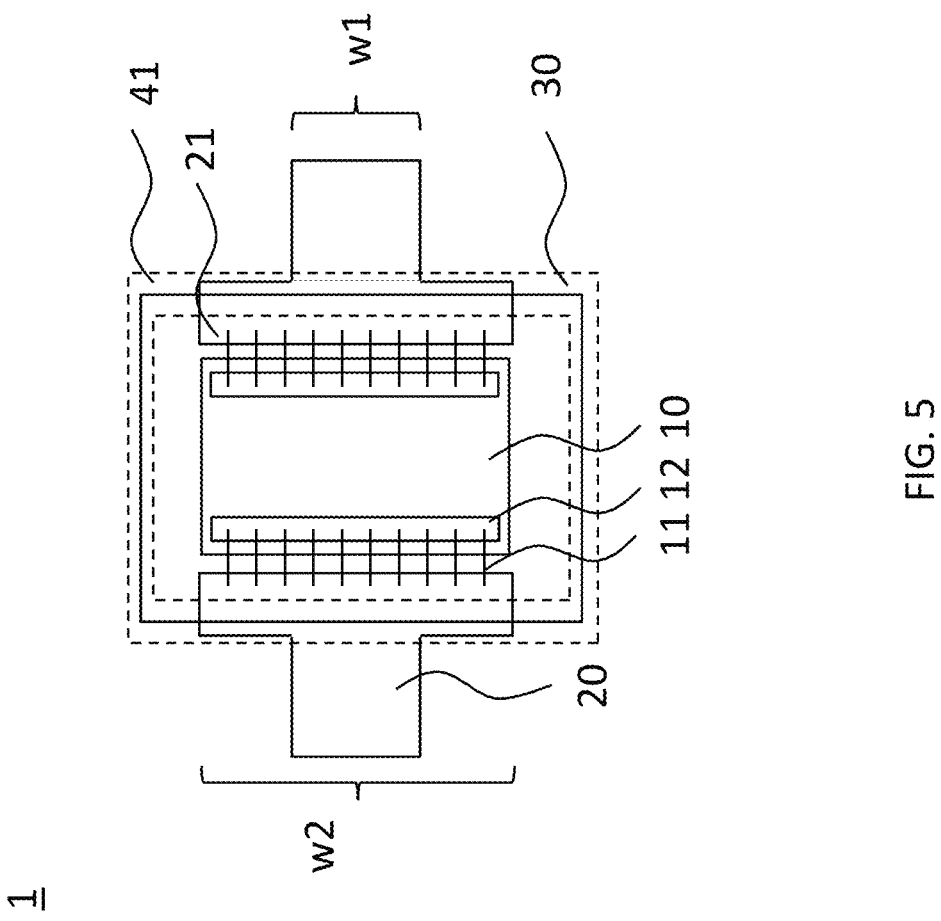
FIG. 5 illustrates a schematic top view of the package of FIG. 1.

FIG. 5 illustrates a schematic top view of the known package of FIG. 1. Some embodiments of the present disclosure have a similar top view with the exception of a modified lead. Examples of such leads are shown in FIG. 6.

Figure 6:
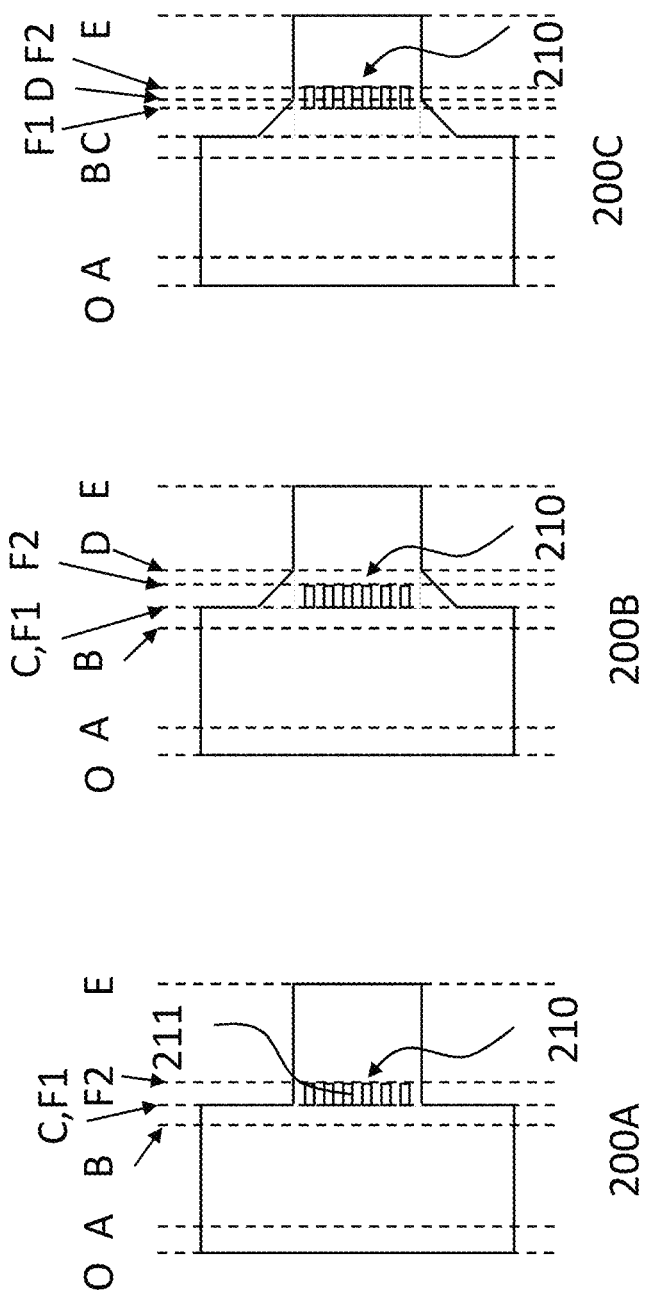
FIG. 6 illustrates three examples of modified leads in accordance with the present disclosure that can be used in the package of FIG. 1.

FIG. 6 illustrates three different embodiments for leads 200A, 200B, 200C in accordance with the present disclosure. In each embodiment, several lines are indicated. The region of the leads between line O and line A corresponds to the first lead end, the region between line A and line B corresponds the first segment, the region between line B and line C corresponds to the first part, the region between line C and line D corresponds to the width transition part, and the region between line D and line E corresponds to the second part. This latter part also includes the second lead end (not shown). Although FIG. 6 illustrates embodiments in which the width of the lead changes outside the body of solidified molding compound, the present disclosure equally applies to molded RF power packages in which the width of the lead outside of the body of solidified molding compound remains constant, and which is optionally equal to the width of the lead inside the body of solidified molding compound.

Assuming that the lead is only bent in the region containing the weakening structure 210, i.e. holes 211, the curved segment corresponds to the region between lines F1 and F2. Under this assumption, the first sub-segment and the first part correspond to each other for leads 200A, 200B. For lead 200C, the first sub-segment corresponds to the first part, and a part of the width transition region. Moreover, lead 200C shows that the weakening structure 210 is at least partially arranged in the curved region.

For leads 200A, 200B, 200C it is clear that the width of the first segment, taken parallel to the line A, is identical to the width of the first lead end, and identical to the width of the first part. In lead 200A, the width transition part has an essentially zero length, resulting in a step-wise change in width. For leads 200B, 200C, the width transition part allows for a more gradual change in width.

Again referring to FIG. 5 for definition of w1 and w2, according to the present disclosure, width w2, which is the width of the first lead end, the first segment, and the first part, can be larger than width w1, which is the width of the second lead end. In some embodiments, w2 can be equal to w1 plus at least 1 mm and/or w1/w2 can be less than 0.8.

In FIG. 6, the change in lead width is outside of the body of solidified molding compound, contrary to the known package shown in FIG. 5. This feature is combined with the use of a weakening structure. More in particular, leads 200A, 200B, 200C demonstrate the positioning of the weakening structure relative to the width transition part. It should however be noted that the present disclosure equally relates to molded RF power packages in which only the weakening structure is used.

Figure 7A:
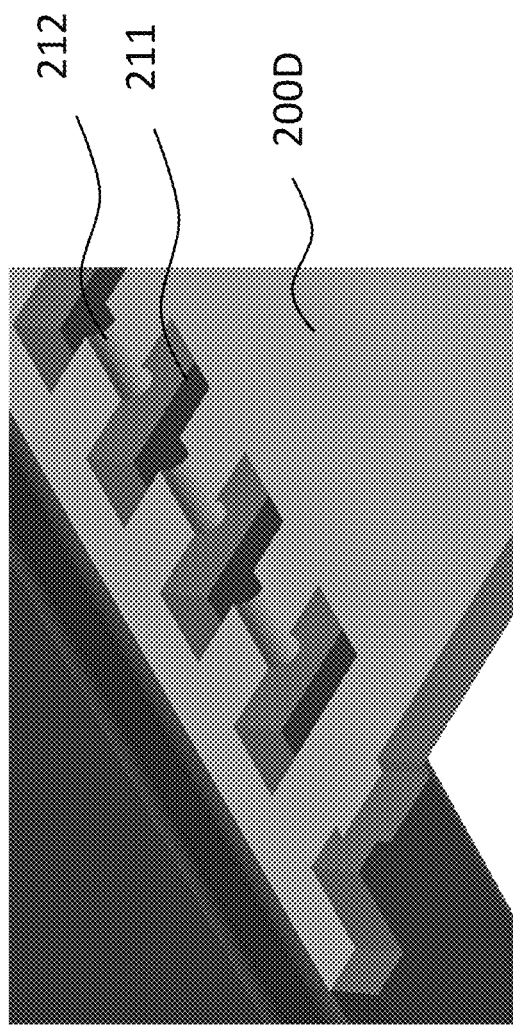
FIGS. 7A-7C illustrate perspective views of different leads in accordance with example embodiments.
Figure 7B:
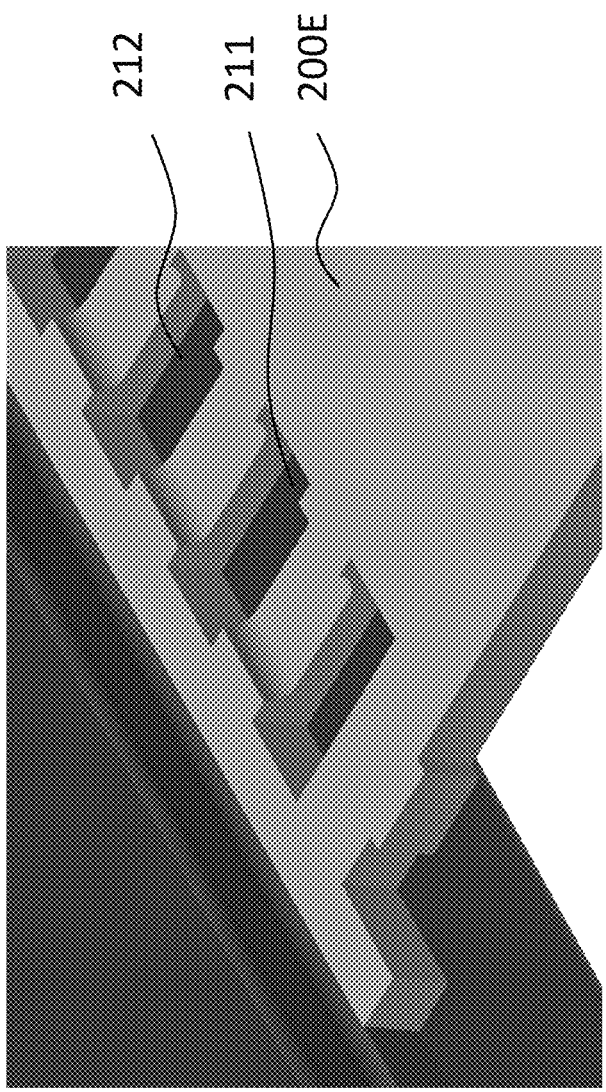
Figure 7C:
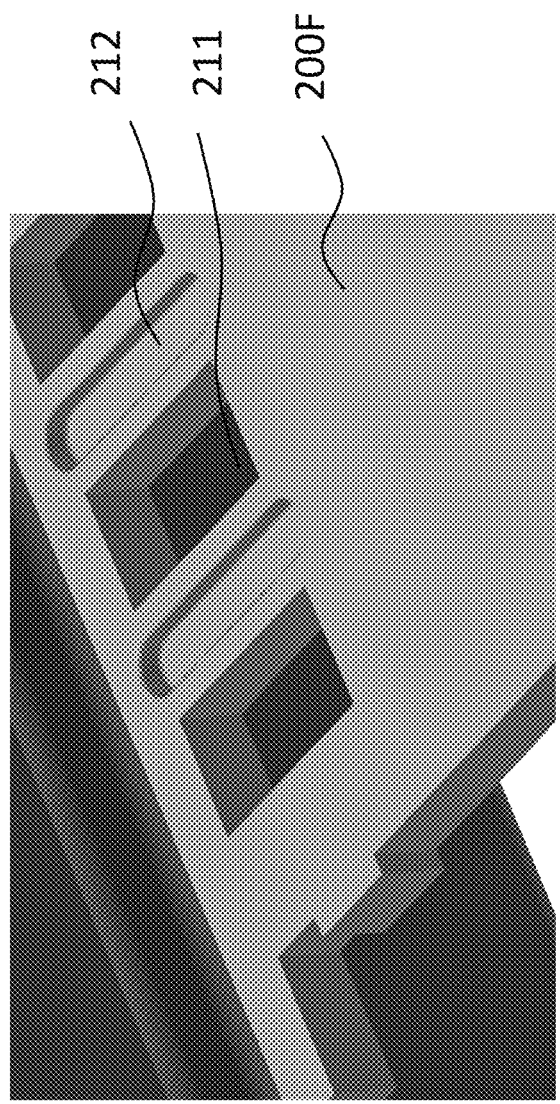

FIGS. 7A-7C illustrate perspective views of different leads 200D, 200E, 200F in accordance with example embodiments. As shown, in leads 200D, 200E elongated holes 211 that extend in a length direction of the lead are combined with elongated recesses 212 that extend in a width direction of the lead. More in particular, recesses 212 and holes 211 are in line, meaning that a line passing through recesses 212 intersects holes 211. For lead 200F, recesses 212 extend in the length direction of the lead parallel and next to holes 212.

It should be noted that according to the present disclosure, the recesses are preferably applied to the top side of the leads, meaning that side of the leads that is directed away from the heat-conducting substrate. However, the present disclosure does not exclude that the recesses are applied to the bottom side of the leads or that the recesses are applied to both the bottom side and the top side of the leads.

Although the present disclosure has been described using detailed embodiments thereof, it is noted that the present disclosure is not limited to these embodiments. Instead, the embodiments can be modified without deviating from the scope of the present disclosure which is defined by the appended claims.

What is claimed is:

1. A molded radiofrequency, 'RF', power package, comprising:
   a heat-conducting substrate having a first surface and an opposing second surface, wherein the second surface of the heat-conducting substrate is exposed on a backside of the package;
   a semiconductor die having a first side and a second side, the semiconductor die being arranged with its first side on the first surface of the heat-conducting substrate, said semiconductor die having an RF power transistor integrated on its second side;
   a plurality of leads;
   a body of solidified molding compound that fixedly connects the heat-conducting substrate to the plurality of leads by directly adhering to the plurality of leads and the heat-conducting substrate;
   a lid fixedly connected to the body of solidified molding compound;
   wherein each lead comprises a first lead end, an opposing second lead end, a first segment connected directly to the first lead end, and a second segment connected directly on one end to the second lead end and on an opposing end to the first segment;
   wherein the RF power transistor is connected to the first lead ends of the plurality of leads using a plurality of bondwires;
   wherein, for each lead, the first and second segment fully extend inside and outside the body of solidified molding compound, respectively;
   wherein the second segments of the plurality of leads are bent or configured to be bent thereby dividing each second segment in:
      a first sub-segment extending substantially parallel to the heat-conducting substrate and away from the body of solidified molding compound;
      a curved sub-segment; and
      a second sub-segment extending obliquely relative to the first sub-segment and connected to the first sub-segment through the curved sub-segment;
   wherein the leads each further comprise a weakening structure arranged at least partially in the curved sub-segment, the weakening structure comprising a hole through the lead.

2. The molded RF power package according to claim 1, wherein a ratio between a length of the second sub-segment and a length of the first sub-segment is at least 1.

3. The molded RF power package according to claim 2, wherein a ratio between a length of the first sub-segment and a length of the curved sub-segment and is at least 0.2.

4. The molded RF power package according to claim 1, wherein a thickness of the leads lies in a range between 200 and 500 micrometer and wherein the leads are made from copper, copper alloy, or other metal or metal alloy.

5. The molded RF power package according to claim 1, wherein for each lead a maximum width of the second segment in a direction parallel to a side of the body of solidified molding compound through which said each lead extends lies in a range between 1 and 20 millimeter.

6. The molded RF power package according to claim 1, wherein for each lead the weakening structure comprises a plurality of holes spaced apart in a direction parallel to a side of the body of solidified molding compound through which said each lead extends.

7. The molded RF power package according to claim 6, wherein the holes of each lead have a maximum inner size between 200 and 2000 micrometer and between 400 and 2000 micrometer in the direction parallel and in a direction perpendicular to a side of the body of solidified molding compound through which said each lead extends, respectively.

8. The molded RF power package according to claim 6, wherein the weakening structure of each lead comprises an elongated recess extending in a direction parallel to a side of the body of solidified molding compound through which said each lead extends, wherein for each lead the elongated recess is provided in line with the holes.

9. The molded RF power package according to claim 6, wherein the weakening structure of each lead comprises at least one elongated recess extending in a direction perpendicular to a side of the body of solidified molding compound through which said each lead extends, wherein said at least one elongated recess extends in between a pair of adjacent holes in said each lead.

10. The molded RF power package according to claim 1, wherein the weakening structure of each lead comprises an elongated recess extending in a direction parallel to a side of the body of solidified molding compound through which said each lead extends.

11. The molded RF power package according to claim 1, wherein for each lead the first segment and the first sub-segment have an identical maximum width in a direction parallel to a side of the body of solidified molding compound through which said each lead extends.

12. The molded RF power package according to claim 11, wherein for each lead the first lead end and the first segment have an identical maximum width in a direction parallel to a side of the body of solidified molding compound through which said each lead extends.

13. The molded RF power package according to claim 11, wherein for each lead the second segment is divided into:
a first part directly adjacent to the first segment;
a second part of which a width in said direction parallel to a side of the body of solidified molding compound through which said each lead extends is less than the maximum width of the first part; and
a width transition part connecting the first part and second part and of which a width in said direction parallel to a side of the body of solidified molding compound through which said each lead extends decreases when moving away from the body.

14. The molded RF power package according to claim 13, wherein for each lead a length of the first part in a direction perpendicular to a side of the body of solidified molding compound through which said each lead extends lies in a range between 100 and 1000 micrometer.

15. The molded RF power package according to claim 13, wherein the first sub-segment corresponds to the first part and a part of the width transition part.

16. The molded RF power package according to claim 13, wherein the first sub-segment corresponds to the first part.

17. The molded RF power package according to claim 13, wherein the weakening structures are completely contained in the width transition part.

18. The molded RF power package according to claim 13, wherein for each lead a width of the first part and/or a width of the first segment is substantially constant along a direction perpendicular to a side of the body of solidified molding compound through which said each lead extends.

19. The molded RF power package according to claim 13, wherein for each lead a width of the first lead end in a direction parallel to a side of the body of solidified molding compound through which said each lead extends equals the width of the corresponding second lead end in the same direction plus at least 1 millimeter or wherein a ratio between the width of the second lead end and the width of the first lead end is less than 0.8.

20. The molded RF power package according to claim 1, further comprising an air cavity inside the RF molded power package in which the semiconductor die and bondwires are arranged, the air cavity being defined by the heat-conducting substrate, the body of solidified molding compound, and the lid.

21. The molded RF power package according to claim 1, wherein the semiconductor die and bondwires are encapsulated by the body of solidified molding compound.

22. The molded RF power package according to claim 1, wherein the leads have a gull wing shape.

23. A method for manufacturing the molded RF power package of claim 1, comprising the steps of:
providing a heat-conducting substrate having a first surface and an opposing second surface;
providing a semiconductor die, said semiconductor die having an RF power transistor integrated thereon;
providing a lead frame comprising a lead frame body, a plurality of leads connected to the lead frame body, and a heat-conducting substrate connected to the lead frame body, wherein each lead comprises a first lead end, an opposing second lead end, a first segment connected directly to the first lead end, and a second segment connected directly on one end to the second lead end and on an opposing end to the first segment;
arranging the lead frame into a molding cavity;
applying a molding compound into the molding cavity and allowing the molding compound to solidify for forming a body of solidified molding compound that fixedly connects the heat-conducting substrate to the plurality of leads by directly adhering to the plurality of leads and the heat-conducting substrate, wherein the first and second segment fully extend inside and outside the body of solidified molding compound, respectively;
providing a lid and fixedly connecting the lid to the body;
wherein by bending the second segments of the plurality of leads, each second segment is divided at least in a first sub-segment extending substantially parallel to the heat-conducting substrate and away from the body of solidified molding compound, a curved sub-segment, and a second sub-segment extending obliquely relative to the first sub-segment and connected to the first sub-segment through the curved sub-segment;
wherein the leads each further comprise a weakening structure arranged at a boundary between the first and second sub-segment, the weakening structure comprising a hole through the lead;
the method comprising the further steps of arranging the semiconductor die onto the first surface of the heat-conducting substrate and connecting the electronic circuitry to the first lead end of the plurality of leads using a plurality of bondwires, wherein said arranging of the semiconductor die onto the first surface of the heat-conducting substrate is performed prior to or after applying the molding compound.

24. The method according to claim 23, wherein, for molded RF power packages comprising an air cavity, the wire bonding is performed after the molding, and wherein, for molded RF power packages not comprising an air cavity, the wire bonding is performed before molding.

* * * * *